United States Patent
Morgan et al.

(10) Patent No.: US 11,757,221 B2
(45) Date of Patent: Sep. 12, 2023

(54) ELECTRICAL CONNECTOR HAVING CONTACT MODULES

(71) Applicant: TE Connectivity Services GmbH, Schaffhausen (CH)

(72) Inventors: Chad William Morgan, Carney's Point, NJ (US); John Joseph Consoli, Harrisburg, PA (US); Justin Dennis Pickel, Hummelstown, PA (US)

(73) Assignee: TE CONNECTIVITY SOLUTIONS GMBH, Schaffhausen (CH)

( * ) Notice: Subject to any disclaimer, the term of this patent is extended or adjusted under 35 U.S.C. 154(b) by 36 days.

(21) Appl. No.: 17/516,803

(22) Filed: Nov. 2, 2021

(65) Prior Publication Data

US 2023/0137275 A1  May 4, 2023

(51) Int. Cl.
*H01R 12/72* (2011.01)
*H01R 12/75* (2011.01)
*H01R 12/70* (2011.01)
*H01R 24/28* (2011.01)
*H01R 13/73* (2006.01)
*H01R 13/631* (2006.01)
*H01R 24/20* (2011.01)
*H01R 107/00* (2006.01)

(52) U.S. Cl.
CPC ....... *H01R 12/727* (2013.01); *H01R 12/7047* (2013.01); *H01R 12/75* (2013.01); *H01R 13/6315* (2013.01); *H01R 13/73* (2013.01); *H01R 24/20* (2013.01); *H01R 24/28* (2013.01); *H01R 2107/00* (2013.01)

(58) Field of Classification Search
CPC .... H01R 12/727; H01R 12/724; H01R 12/75; H01R 12/73; H01R 12/7047; H01R 12/716; H01R 12/722; H01R 13/73; H01R 13/6315; H01R 13/6583; H01R 13/6586; H01R 13/6587; H01R 2107/00; H01R 24/20; H01R 24/28
USPC .......................................... 439/246, 248, 65
See application file for complete search history.

(56) References Cited

U.S. PATENT DOCUMENTS

| | | | |
|---|---|---|---|
| 5,947,753 A * | 9/1999 | Chapman | H01R 12/52 361/803 |
| 8,444,434 B2 * | 5/2013 | Davis | H01R 13/6587 439/607.07 |
| 9,017,087 B1 * | 4/2015 | Rossman | H01R 13/73 439/248 |

(Continued)

*Primary Examiner* — Marcus E Harcum

(57) ABSTRACT

An electrical connector includes a connector housing having a mating end at a front of the connector housing configured to be mating with a mating electrical connector. The connector housing includes a contact module chamber. An electrical connector includes a stack of contact modules received in the contact module chamber. Each contact module includes a module body holding a plurality of contacts. The contacts have mating ends at the mating end of the connector housing for mating with the mating electrical connector; and an electrical connector includes a contact module biasing members between the contact modules and the connector housing to forward bias the contact modules in the contact module chamber, wherein the contact module biasing members are compressible to allow the contact modules to move independent from each other relative to the connector housing in the contact module chamber when mating with the mating electrical connector.

20 Claims, 6 Drawing Sheets

(56) References Cited

U.S. PATENT DOCUMENTS

| | | | |
|---|---|---|---|
| 10,177,467 B1* | 1/2019 | Blackburn | H01R 13/504 |
| 10,177,483 B1* | 1/2019 | Horning | H01R 13/6473 |
| 10,381,762 B2* | 8/2019 | Consoli | H01R 13/562 |
| 10,439,333 B2* | 10/2019 | Chalas | H01R 12/716 |
| 10,461,470 B2* | 10/2019 | Consoli | H01R 12/7064 |
| 2004/0224559 A1* | 11/2004 | Nelson | H01R 12/727 439/607.05 |
| 2005/0064736 A1* | 3/2005 | Korsunsky | H01R 12/85 439/65 |
| 2008/0045087 A1* | 2/2008 | Yi | H01R 12/737 439/637 |
| 2008/0299805 A1* | 12/2008 | Higuchi | G01R 1/0735 439/157 |
| 2009/0163047 A1* | 6/2009 | Jeon | H01R 12/724 439/701 |
| 2010/0068944 A1* | 3/2010 | Scherer | H01R 13/4361 439/668 |
| 2013/0017710 A1* | 1/2013 | Houtz | H01R 12/724 439/374 |
| 2014/0206221 A1* | 7/2014 | Morley | H01R 13/6315 439/271 |

* cited by examiner

ELECTRICAL CONNECTOR HAVING
CONTACT MODULES

BACKGROUND OF THE INVENTION

The subject matter herein relates generally to communication systems.

Communication systems use electrical connectors to electrically connect various components to allow data communication between the components. For example, in a backplane system, circuit board assemblies having electrical connectors mounted to circuit boards are mated to electrically connect the circuit boards. The system may include an equipment rack used to support the circuit board assemblies relative to each other. The circuit board assemblies may be mated at angles relative to each other leading to the mating interface being slightly offset or skewed, which can lead to improper mating of some of the contacts. Additionally, known rack mount circuit board backplane connectors typically need to absorb large dimensional tolerance accumulation of the relative distance between the circuit boards inserted from both sides of the equipment rack. Typical tolerance distances may be 1.5 mm or more. The contacts of the backplane connectors at the mating zone are sized to accommodate the circuit board mating tolerance distances. For example, the lengths of the contacts include the lengths required for mechanical mating and any designed contact wipe length plus the additional circuit board mating tolerance distance. The contacts have such length to accommodate the possible range of circuit board mating conditions. The additional length of the contacts is typically provided as an extension of the stub of the contact, which is the portion of the contact that extends past the mating point, to ensure that the contacts remain mated regardless of the circuit board positions. In high speed connectors, the stubs can significantly degrade the signal integrity performance of the connector. The electrical stub acts as a reflective element for energy that travels along the stub. When the energy travels back at certain combinations of signal wavelength (for example, frequency) and physical stub length, the stub can generate a null in transmitted energy at a specific frequency. When the stub is long enough, and the respective frequency low enough, the null is detrimental to the transmitted energy of the signal that reaches the receiver.

A need remains for electrical connectors of a communication system having improved mating for improved signal integrity performance.

BRIEF DESCRIPTION OF THE INVENTION

In one embodiment, an electrical connector is provided and includes a connector housing having a mating end at a front of the connector housing configured to be mating with a mating electrical connector. The connector housing includes a contact module chamber. An electrical connector includes a stack of contact modules received in the contact module chamber. Each contact module includes a module body holding a plurality of contacts. The contacts have mating ends at the mating end of the connector housing for mating with the mating electrical connector; and an electrical connector includes a contact module biasing members between the contact modules and the connector housing to forward bias the contact modules in the contact module chamber, wherein the contact module biasing members are compressible to allow the contact modules to move independent from each other relative to the connector housing in the contact module chamber when mating with the mating electrical connector.

In another embodiment, a circuit board assembly includes a circuit board having a mounting surface. The circuit board has a mating edge and side edges extending from the mating edge to a rear edge. The circuit board has a board guide feature for locating the circuit board in an equipment rack; and a circuit board assembly includes an electrical connector mounted to the mounting surface of the circuit board at the mating edge. The electrical connector includes a connector housing having a mating end at a front of the connector housing configured to be mated with a mating electrical connector The connector housing includes a contact module chamber. The electrical connector includes a stack of contact modules received in the contact module chamber. Each contact module includes a module body holding a plurality of contacts. The contacts have mating ends at the mating end of the connector housing for mating with the mating electrical connector, and the electrical connector includes contact module biasing members between the contact modules and the connector housing to forward bias the contact modules in the contact module chamber, wherein the contact module biasing members are compressible to allow the contact modules to move independent from each other relative to the connector housing and the circuit board in the contact module chamber when mated with the mating electrical connector.

In a further embodiment, a communication system includes a first circuit board assembly including a first circuit board and a first electrical connector coupled to the first circuit board. The first electrical connector includes a first connector housing having a mating end at a front of the first connector housing, the first connector housing includes a first contact module chamber. The first electrical connector includes a stack of first contact modules received in the first contact module chamber. Each first contact module includes a first module body holding a plurality of first contacts. The first contacts have mating ends at the mating end of the first connector housing, and the first electrical connector include first contact module biasing members between the first contact modules and the first connector housing to forward bias the first contact modules in the first contact module chamber; and communication system includes a second circuit board assembly including a second circuit board and a second electrical connector coupled to the second circuit board. The second electrical connector has a second connector housing holding second contacts in a contact array. The second connector housing has a mating end coupled to the mating end of the first connector housing along a mating axis; communication system includes wherein the first contact module biasing members are compressible to allow the first module body and the first contacts of each first contact module to float independent from each other relative to the first connector housing in the first contact module chamber.

DETAILED DESCRIPTION OF THE INVENTION

Figure 1:
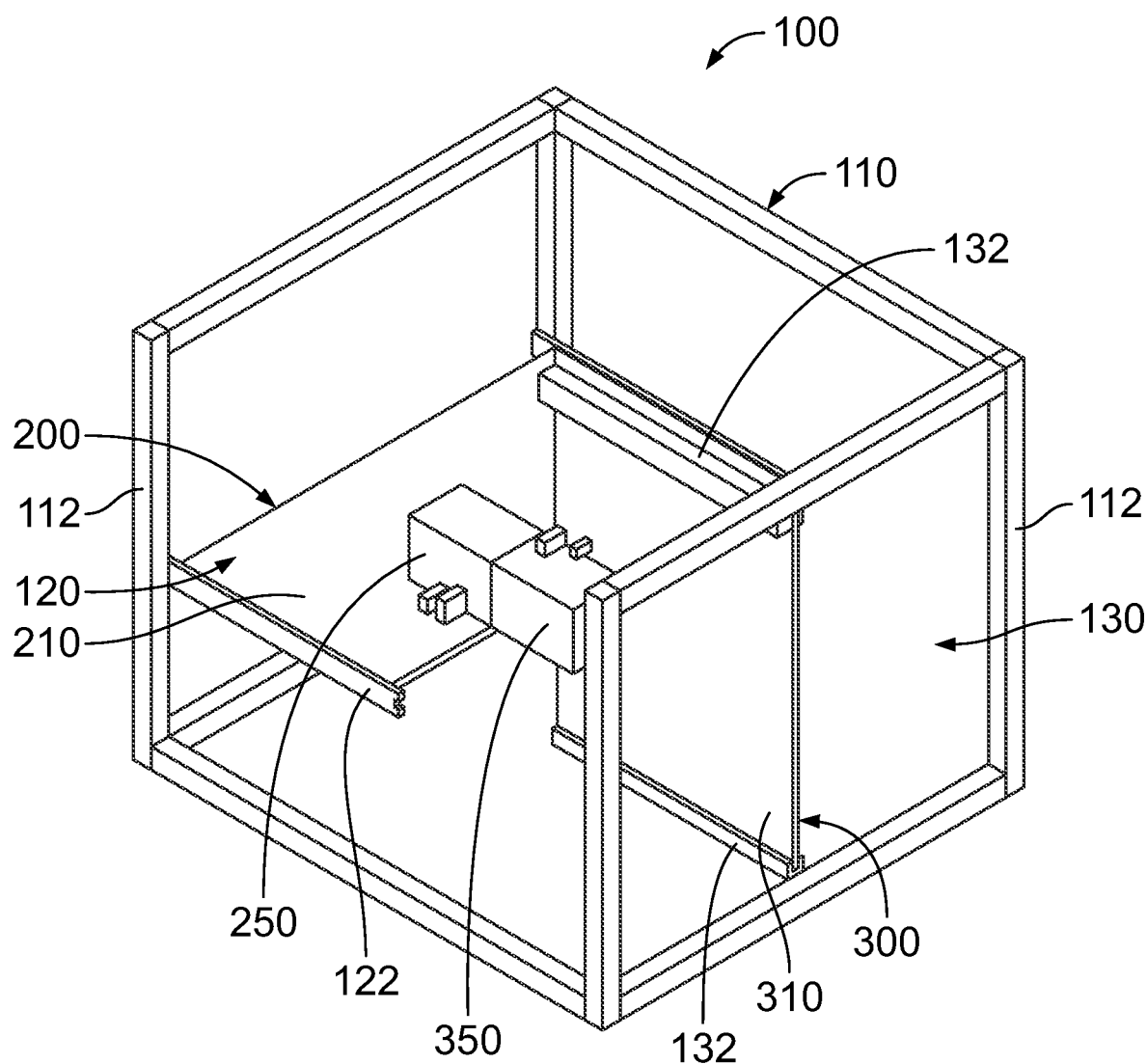
FIG. 1 is a schematic view of a communication system in accordance with an exemplary embodiment.

FIG. 1 is a schematic view of a communication system 100 in accordance with an exemplary embodiment. The communication system 100 includes a first circuit board assembly 200 and a second circuit board assembly 300 electrically coupled together. In various embodiments, the communication system 100 may be a server or network switch. In other various embodiments, the communication system 100 may be a backplane system. The first circuit board assembly 200 and/or the second circuit board assembly 300 may be a backplane assembly. The first circuit board assembly 200 and/or the second circuit board assembly 300 may be a daughtercard assembly. The first circuit board assembly 200 and/or the second circuit board assembly 300 may be a motherboard assembly.

In an exemplary embodiment, the first circuit board assembly 200 and/or the second circuit board assembly 300 includes a compressible mating interface to take up mating tolerance for the communication system 100. For example, portions of the connectors of the first circuit board assembly 200 and/or the second circuit board assembly 300 may be spring loaded or otherwise compressible. Optionally, the first circuit board assembly 200 and/or the second circuit board assembly 300 may include a spring loaded connector configured to be compressed in the mating direction.

In an exemplary embodiment, the communication system 100 includes an equipment rack 110 used to hold the first circuit board assembly 200 and/or the second circuit board assembly 300. The equipment rack 110 includes frame members 112 forming one or more chambers for the first circuit board assembly 200 and/or the second circuit board assembly 300. In the illustrated embodiment, the equipment rack 110 includes a front chamber 120 configured to receive the first circuit board assembly 200 and a rear chamber 130 configured to receive the second circuit board assembly 300. Optionally, multiple circuit board assemblies may be received in the front chamber 120 and/or the rear chamber 130. The equipment rack 110 may be open at the front and/or the rear and/or the sides. Alternatively, the equipment rack 110 may include walls or panels (not shown) that close the chambers 120, 130 at the front and/or the rear and/or the sides. The equipment rack 110 may include horizontally oriented trays or platforms that divide the chambers 120, 130 into stacked sub-chambers each receiving a corresponding circuit board assembly. The equipment rack 110 may include vertically oriented divider walls that divide the chambers 120, 130 into adjacent sub-chambers each receive a corresponding circuit board assembly.

In an exemplary embodiment, the equipment rack 110 includes front guide elements 122 in the front chamber 120. The front guide elements 122 are used to guide the first circuit board assembly 200 into the front chamber 120. The front guide elements 122 may locate the first circuit board assembly 200 relative to the equipment rack 110, such as for mating with the second circuit board assembly 200. In an exemplary embodiment, the front guide elements 122 are rails or tracks having a slot or groove that receive the first circuit board assembly 200. Other types of guide elements may be used in alternative embodiments, such as tabs, pins, posts, openings, sockets, and the like.

In an exemplary embodiment, the equipment rack 110 includes rear guide elements 132 in the rear chamber 130. The rear guide elements 132 are used to guide the second circuit board assembly 300 into the rear chamber 130. The rear guide elements 132 may locate the second circuit board assembly 300 relative to the equipment rack 110, such as for mating with the first circuit board assembly 200. In an exemplary embodiment, the rear guide elements 132 are rails or tracks having a slot or groove that receive the second circuit board assembly 300. Other types of guide elements may be used in alternative embodiments, such as tabs, pins, posts, openings, sockets, and the like.

During assembly, the first circuit board assembly 200 is loaded into the front chamber 120 through the front end and the second circuit board assembly 300 is loaded into the rear chamber 130 through the rear end. The first and second circuit board assemblies 200, 300 are mated within the equipment rack 110, such as at the center of the equipment rack 110. The first and second circuit board assemblies 200, 300 slide into and out of the equipment rack 110, such as along the guide elements 122, 132. In the illustrated embodiment, the first and second circuit board assemblies 200, 300 are oriented perpendicular to each other. For example, the first circuit board assembly 200 is oriented vertically and the second circuit board assembly 300 is oriented horizontally, or vice versa. In other various embodiments, the first and second circuit board assemblies 200, 300 are oriented parallel to each other. For example, the first and second circuit board assemblies 200, 300 may both be oriented vertically. Alternatively, the first and second circuit board assemblies 200, 300 may both be oriented horizontally.

The first circuit board assembly 200 includes a first circuit board 210 and a first electrical connector 250 coupled to the first circuit board 210. The first electrical connector 250 is configured to be mated with the second circuit board assembly 300. Optionally, the first electrical connector 250 is a floating connector, wherein the first electrical connector 250 is movable relative to the first circuit board 210. The first electrical connector 250 may be moved when mated with the second circuit board assembly 300. For example, the housing of the first electrical connector 250 may be compressible and movable relative to the first circuit board 210 and/or the contact modules of the first electrical connector 250 may be compressible and movable within the housing to define a compressible mating interface. In various embodiments, the first electrical connector 250 may be a fixed connector, wherein the first electrical connector 250 is fixed relative to the first circuit board 210, but the contact modules may be movable and compressed when mated with the second circuit board assembly 300. The movable contact modules may accommodate angled or offset mating.

The second circuit board assembly 300 includes a second circuit board 310 and a second electrical connector 350 coupled to the second circuit board 310. The second electrical connector 350 is configured to be mated with the first electrical connector 250 of the first circuit board assembly 200. Optionally, the second electrical connector 350 may be a floating connector, wherein the second electrical connector 350 is movable relative to the second circuit board 310. The second electrical connector 350 may be moved when mated with the second circuit board assembly 300. For example, the housing of the second electrical connector 350 may be compressible and/or the contact modules of the second electrical connector 350 may be compressible and movable within the housing to define a compressible mating interface. In various embodiments, the second electrical connector 350 may be a fixed connector, wherein the second electrical connector 350 is fixed relative to the second circuit board 310, but the contact modules may be movable and compressed when mated with the first electrical connector 250. The movable contact modules may accommodate angled or offset mating.

Figure 2:
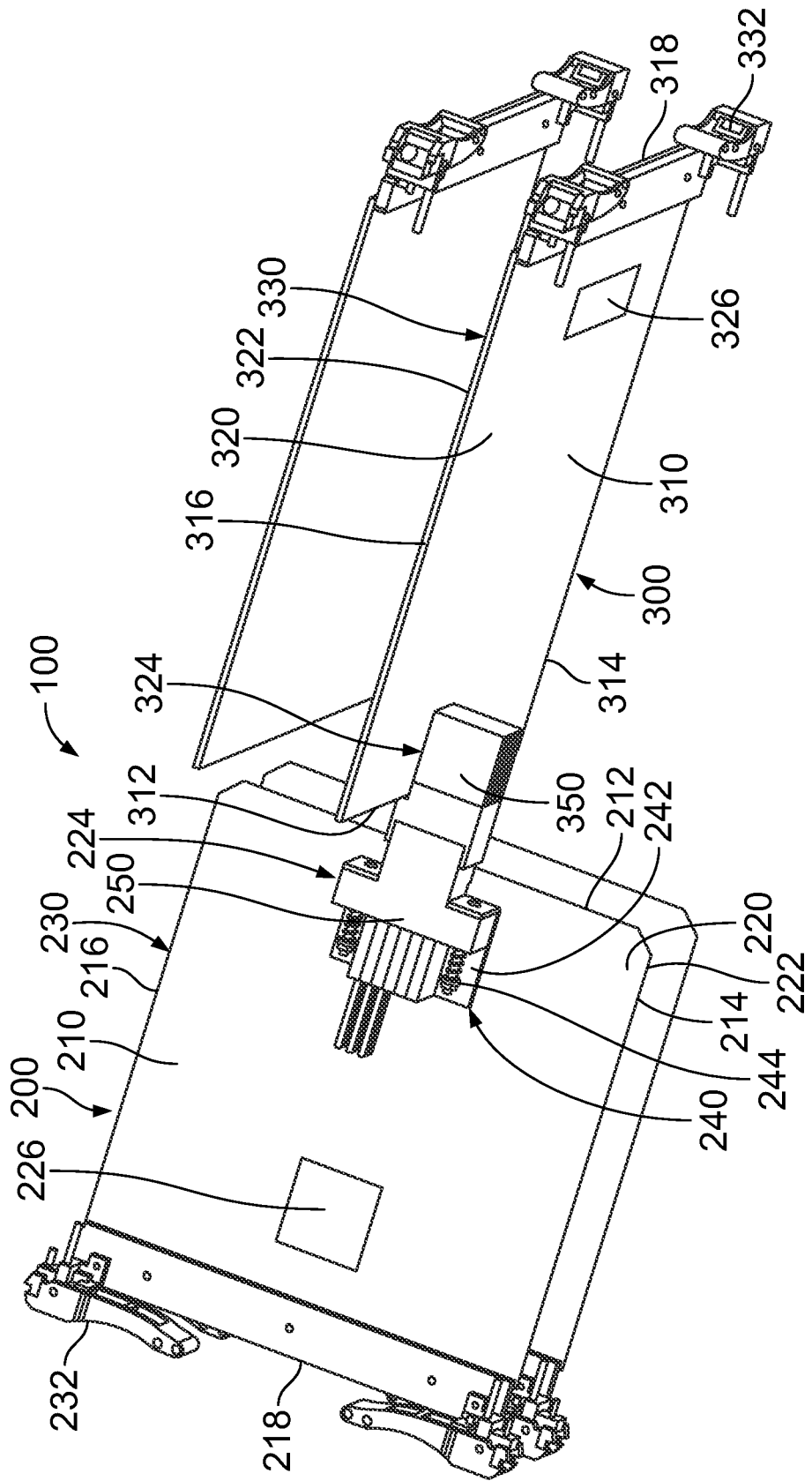
FIG. 2 is a top perspective view of the communication system in accordance with an exemplary embodiment.
Figure 3:
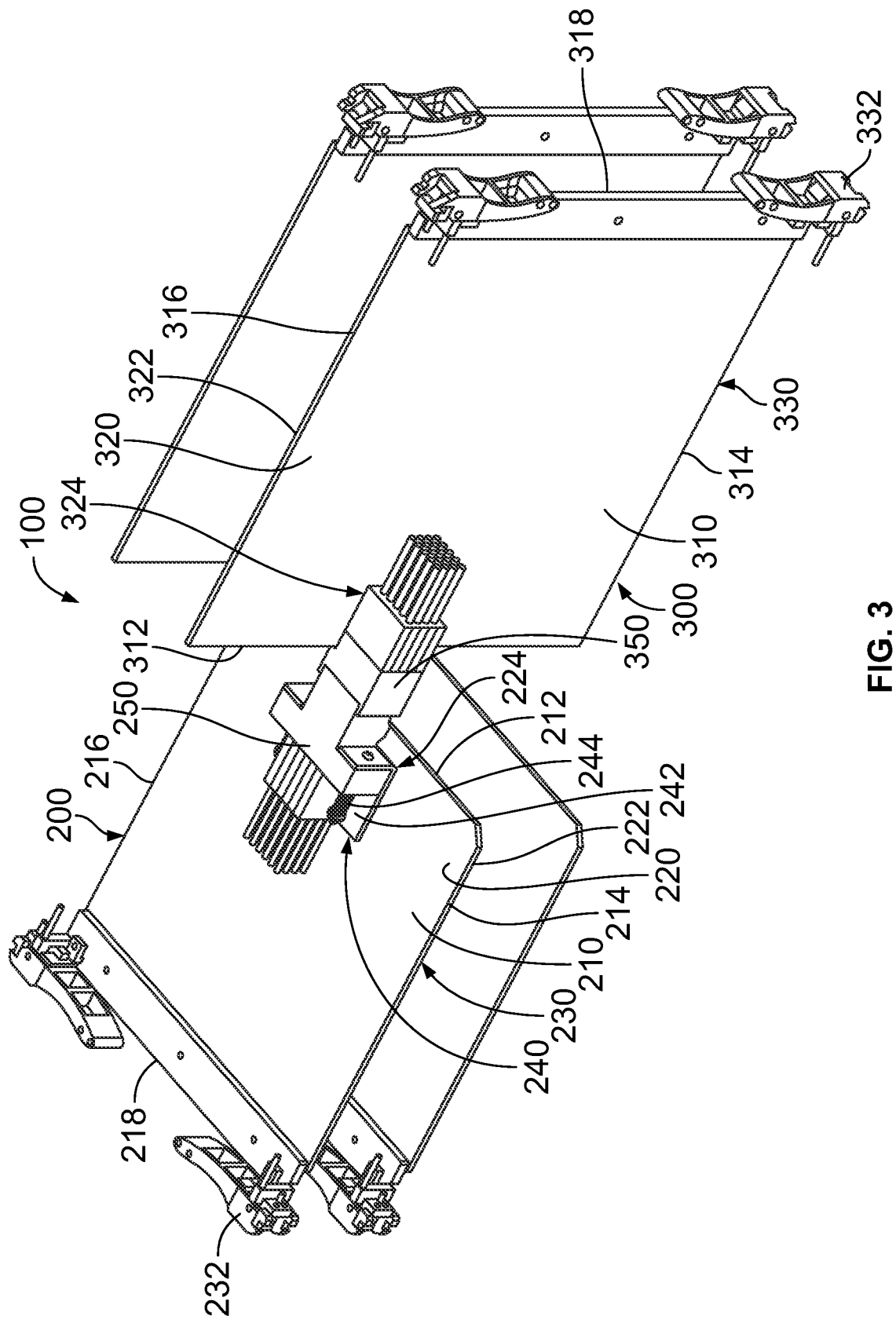
FIG. 3 is a rear perspective view of the communication system in accordance with an exemplary embodiment.

FIG. 2 is a top perspective view of the communication system 100 in accordance with an exemplary embodiment. FIG. 3 is a rear perspective view of the communication system 100 in accordance with an exemplary embodiment. FIG. 2 shows the first electrical connector 250 as a cable connector and the second electrical connector 350 as a board connector. The first electrical connector 250 is a floating connector and the second electrical connector 350 is a fixed connector. FIG. 3 shows the first electrical connector 250 as a cable connector and the second electrical connector 350 as a cable connector. The first electrical connector 250 is a floating connector and the second electrical connector 350 is a fixed connector. In alternative embodiments, the second electrical connector 350 may be a floating connector.

In the illustrated embodiments, the communication system 100 includes multiple front circuit board assemblies 200 and multiple rear circuit board assemblies 300; however, the communication system 100 may include a single front circuit board assembly 200 and/or a single rear circuit board assembly 300. In the illustrated embodiment, the circuit board 210 has a single electrical connector 250 and the circuit board 310 has a single electrical connector 350; however, the circuit board 210 may include multiple electrical connectors 250 and/or the circuit board 310 may include multiple electrical connectors 350.

The first circuit board 210 includes a mating edge 212 at a front of the first circuit board 210 and side edges 214, 216 extending between the mating edge 212 and a rear edge 218. The first circuit board 210 is rectangular in the illustrated embodiment. The first circuit board 210 may have other shapes in alternative embodiments. The circuit board 210 includes first and second surfaces 220, 222 (for example, upper and lower surfaces). The first electrical connector 250 is mounted to the first surface 220 of the circuit board 210 at a mounting area 224. Optionally, the mounting area 224 may be located proximate to the mating edge 212. One or more electrical connectors may additionally or alternatively be located at the second surface 222.

In an exemplary embodiment, the first circuit board 210 includes one or more electrical components 226 coupled to the first circuit board 210. The electrical components 226 may be chips, integrated circuits, processors, memory modules, electrical connectors or other components. The electrical components 226 may be electrically connected to the circuit board 210, such as through traces, pads, vias or other circuits. In an exemplary embodiment, the electrical components 226 are electrically connected to the first electrical connector 250, such as through the first circuit board 210 or by direct connection through the cables.

The first circuit board 210 includes one or more board guide features 230 for locating the circuit board 210 in the equipment rack 110 (shown in FIG. 1). The board guide features 230 are configured to be coupled to the corresponding guide elements 122 (shown in FIG. 1). In the illustrated embodiment, the board guide features 230 are defined by the edges of the circuit board 210 along the side edges 214, 216, which are configured to slide into grooves of the track defining the guide elements 122. Other types of guide features may be used in alternative embodiments, such as rails, slots tabs, pins, and the like.

In an exemplary embodiment, the first circuit board assembly 200 includes latching features 232 at the rear edge 218. The latching features 232 are used to secure the first circuit board assembly 200 to the equipment rack 110. The latching features 232 may be used to press the circuit board 210 forward (toward the second circuit board 310) during mating or may be used to pull the circuit board 210 rearward during unmating.

In an exemplary embodiment, the first circuit board assembly 200 includes a first connector mount 240. The first connector mount 240 includes a bracket 242 and one or more biasing members 244 coupled to the bracket 242 and the electrical connector 250. The biasing members 244 forward bias the electrical connector 250 for mating with the second electrical connector 350. In an exemplary embodiment, the biasing members 244 are springs, such as coil springs. Other types of biasing members may be used in alternative embodiments, such as compressible foam members. The biasing members 244 allow the electrical connector 250 to move relative to the circuit board 210, such as during mating with the second electrical connector 350. The biasing members 244 provide compressive forces for maintaining mechanical and electrical connection between the first and second electrical connectors 250, 350. The biasing members 244 accommodate the mating tolerances between the circuit board assemblies 200, 300 within the equipment rack 110. For example, the circuit board 210 may have a positional range within the equipment rack 110 (for example, position of the mating edge 212 within the equipment rack 110 may vary by approximately 1.5 mm). The biasing members 244 may accommodate some or all of the mating dimensional tolerance distance (for example, approximately 1.5 mm) of the circuit board 210 in the equipment rack 110. In an exemplary embodiment, the electrical connector 250 may include compliance features to allow further floating movement at the mating interface to accommodate the mating tolerances. For example, the contact modules of the electrical connector 250 may be movable relative to the connector housing, such as in the mating direction, to accommodate the mating tolerances. The contact modules of the electrical connector 250 may be movable relative to the connector housing to accommodate angular tolerance, such as a situation where the circuit boards 210, 310 are mated askew (for example, at an angle).

The second circuit board 310 includes a mating edge 312 at a front of the second circuit board 310 and side edges 314, 316 extending between the mating edge 312 and a rear edge 318. The mating edge 312 faces the mating edge 212 of the first circuit board 210. The circuit board 310 includes first and second surfaces 320, 322 (for example, left side and right side). The second electrical connector 350 is mounted to the first surface 320 of the circuit board 310 at a mounting area 324. Optionally, the mounting area 324 may be located proximate to the mating edge 312. One or more electrical connectors may additionally or alternatively be located at the second surface 322.

In an exemplary embodiment, the second circuit board 310 includes one or more electrical components 326 coupled to the second circuit board 310. The electrical components 326 may be chips, integrated circuits, processors, memory modules, electrical connectors or other components. The electrical components 326 may be electrically connected to the circuit board 310, such as through traces, pads, vias or other circuits. In an exemplary embodiment, the electrical components 326 are electrically connected to the second electrical connector 350, such as through the second circuit board 310 or by direct connection through cables.

The second circuit board 310 includes one or more board guide features 330 for locating the circuit board 310 in the equipment rack 110 (shown in FIG. 1). The board guide features 330 are configured to be coupled to the corresponding guide elements 132 (shown in FIG. 1). In the illustrated embodiment, the board guide features 330 are defined by the edges of the circuit board 310 along the side edges 314, 316, which are configured to slide into grooves of the track defining the guide elements 132. Other types of guide features may be used in alternative embodiments, such as rails, slots tabs, pins, and the like. In an exemplary embodiment, the electrical connector 350 may include compliance features to allow floating movement at the mating interface to accommodate mating tolerances. For example, the contact modules of the electrical connector 350 may be movable relative to the connector housing, such as in the mating direction, to accommodate the mating tolerances. The contact modules of the electrical connector 350 may be movable relative to the connector housing to accommodate angular tolerance, such as a situation where the circuit boards 210, 310 are mated askew (for example, at an angle).

In an exemplary embodiment, the second circuit board assembly 300 includes latching features 332 at the rear edge 318. The latching features 332 are used to secure the second circuit board assembly 300 to the equipment rack 110. The latching features 332 may be used to press the circuit board 310 forward (toward the first circuit board 210) during mating or may be used to pull the circuit board 310 rearward during unmating.

Figure 4:
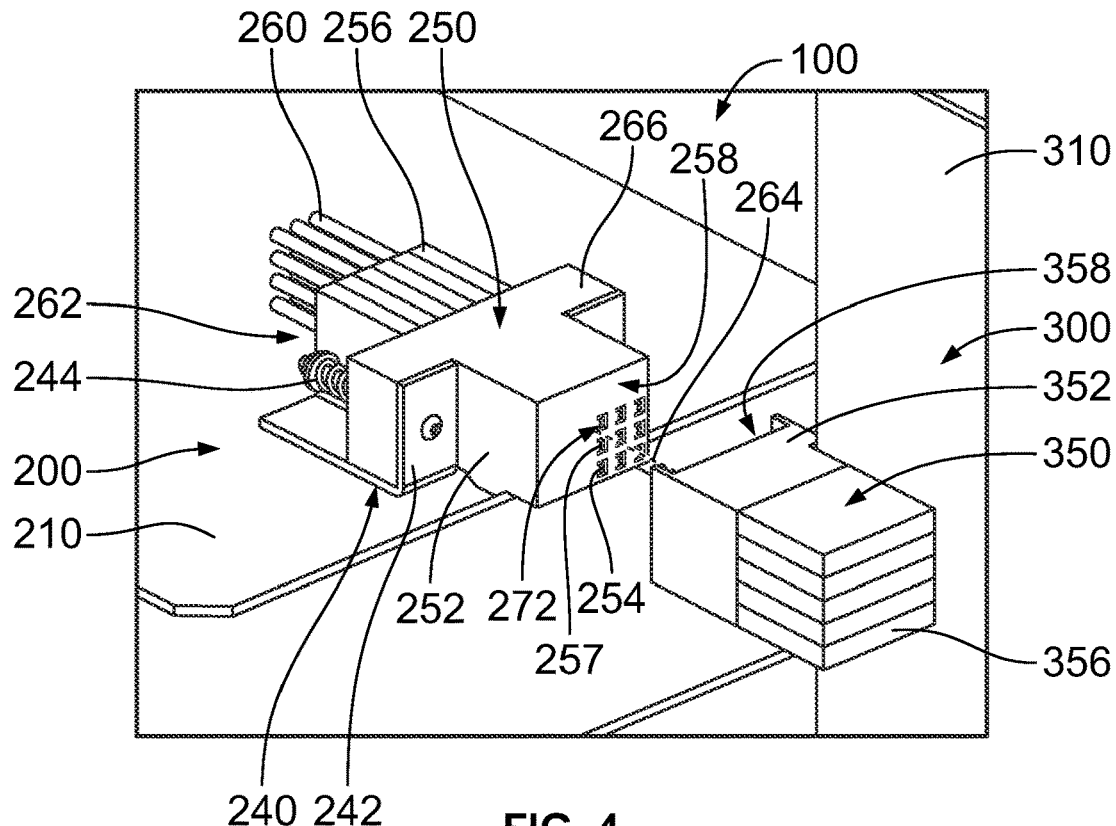
FIG. 4 is a perspective view of a portion of the communication system showing the mating interface of the first circuit board assembly in accordance with an exemplary embodiment.
Figure 5:
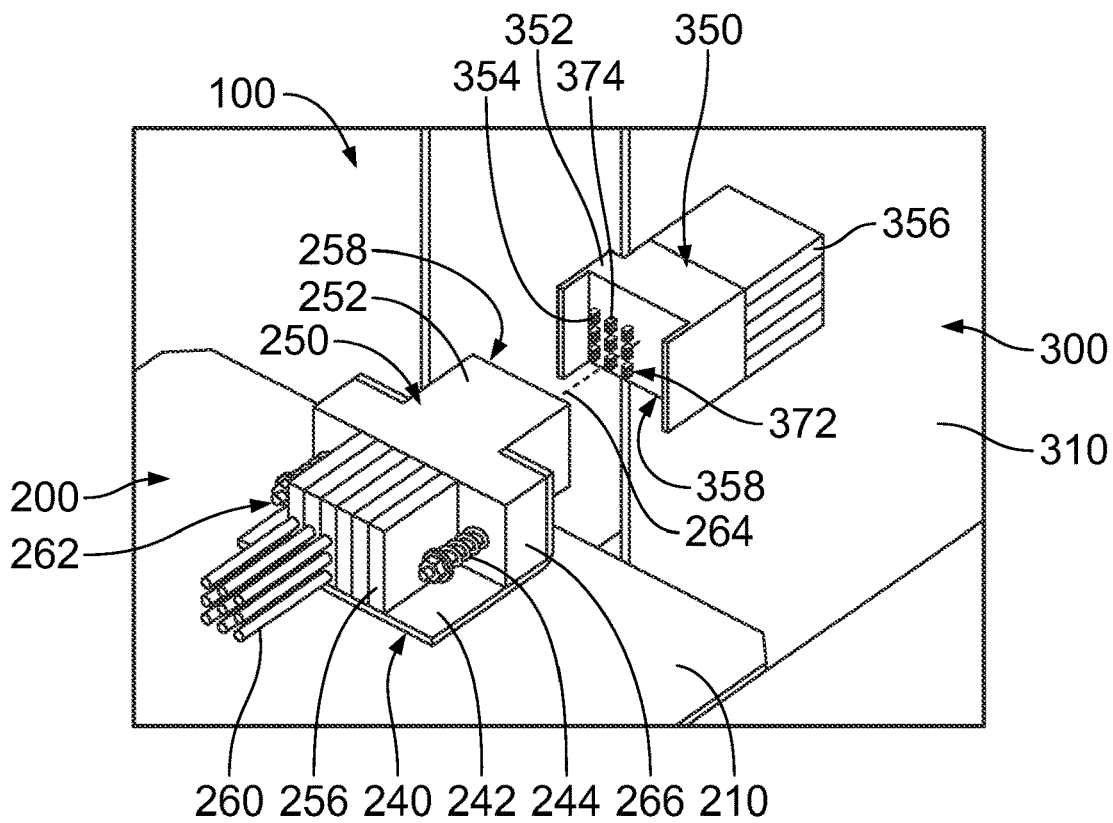
FIG. 5 is a perspective view of a portion of the communication system showing the mating interface of the second circuit board assembly in accordance with an exemplary embodiment.

FIG. 4 is a perspective view of a portion of the communication system 100 showing the mating interface of the first circuit board assembly 200 in accordance with an exemplary embodiment. FIG. 5 is a perspective view of a portion of the communication system 100 showing the mating interface of the second circuit board assembly 300 in accordance with an exemplary embodiment. In an exemplary embodiment, the first electrical connector 250 is a receptacle connector and the second electrical connector 350 is a header connector. However, in an alternative embodiment, the first electrical connector 250 is a header connector and the second electrical connector 350 is a receptacle connector. Other types of connectors may be used in alternative embodiments. In an exemplary embodiment, the first circuit board assembly 200 has a compressible mating interface in the illustrated embodiment (for example, the contacts are movable relative to the housing during mating). The second circuit board assembly 300 has a fixed mating interface in the illustrated embodiment (for example, the contacts are fixed relative to the housing during mating). However, the second circuit board assembly 300 may have a compressible mating interface (for example, the contacts are movable relative to the housing during mating).

The first electrical connector 250 includes a connector housing 252 holding first contacts 254 (FIG. 4) in a contact array. In various embodiments, the contacts 254 may be arranged together in first contact modules 256, also known as chicklets, which may be overmolded leadframes. In an exemplary embodiment, the first contact modules 256 are movably coupled to the connector housing 252. For example, the contact modules 256 may be movable independently from each other relative to the connector housing 252 to form a flexible mating interface. In an exemplary embodiment, contact module biasing members are provided between the contact modules 256 and the connector housing 252 to allow independent movement of the contact modules 256. The connector housing 252 includes a mating end 258 configured to be mated with the second electrical connector 350. The mating end 258 is at the front of the connector housing 252. The contacts 254 are exposed at the mating end 258 for mating with corresponding contacts of the second electrical connector 350.

In the illustrated embodiment, the first electrical connector 250 is a cable connector having a plurality of first cables 260 extending from the connector housing 252. The connector housing 252 includes a cable end 262. The cables 260 extend from the cable end 262. In the illustrated embodiment, the cable end 262 is opposite the mating end 258; however, other orientations are possible in alternative embodiments, such as being a right angle connector with the cable end 262 perpendicular to the mating end 258. The cables 260 may be individual cables 260, such as coaxial cables or twin axial cables. In other embodiments, the cables 260 may be flat, flexible cables, such as flex circuits. The cables 260 are electrically connected to corresponding contacts 254. For example, the cables 260 form parts of the contact modules 256 and are connected to the contacts 254 within the contact modules 256. The cables 260 extend from the contact modules 256. The cables 260 are flexible to allow movement of the first electrical connector 250 relative to the connector housing 252 and the first circuit board 210.

The first electrical connector 250 is configured to be mated with the second electrical connector 350 in a mating direction (along a mating axis 264). The mating end 258 may be perpendicular to the mating axis 264. In an exemplary embodiment, the first electrical connector 250 is movable in a direction parallel to the mating axis 264. For example, the first electrical connector 250 may be pressed rearward during mating. In an exemplary embodiment, the contact modules 256 are movable within the connector housing 252 in the mating direction (for example, along the mating axis 264). For example, the contact modules 256 may be spring biased relative to the connector housing 252.

In an exemplary embodiment, the connector housing 252 includes one or more mounting features 266. The mounting features 266 may be tabs or ears extending from one or more sides of the connector housing 252. The mounting features 266 may be coupled to the connector mount 240, such as to the bracket 242. In an exemplary embodiment, the biasing members 244 are coupled to the mounting features 266. The biasing members 244 may press the mounting features 266 forward against the bracket 242. The bracket 242 operates as a forward stop for the connector housing 252. The bracket 242 positions the first electrical connector 250 for mating with the second electrical connector 350.

The contacts 254 are provided at the mating end 258 for mating with the second electrical connector 350. In an exemplary embodiment, the connector housing 252 includes contact channels 257 at the mating end 258, including both signal channels and ground channels. The ground channels hold ground contacts or ground shields, which provide electrical shielding for the contacts 254. In the illustrated embodiment, the ground channels are C-shaped.

In an exemplary embodiment, the contacts 254 are stamped and formed contacts. The contacts 254 have a metal body extending between a mating end 272 and a terminating end (not shown) opposite the mating end. In an exemplary embodiment, conductors of the cables 260 are terminated to the terminating end of the corresponding contacts 254. For example, the terminating end may include a solder pad, a crimp barrel, an insulation displacement termination, or another type of electrical termination. The contacts 254 may be movable relative to the connector housing 252, such as when the contact modules 256 are moved relative to the connector housing 252. In alternative embodiments, rather than being terminated to the cables 260, the terminating ends of the contacts 254 may be terminated directly to the circuit board 210, such as being soldered or press fit into plated vias of the circuit board 210. In such embodiment, the first electrical connector 250 may be fixed relative to the circuit board 210.

The mating end 272 of each contact 254 includes a mating interface configured to be electrically connected to the corresponding contact of the second electrical connector 350. The mating ends 272 of the contacts 254 are arranged in the contact channels for mating with the second electrical connector 350. In an exemplary embodiment, the mating ends 272 include sockets (such as split beam contacts). Other contact types can be used in alternative embodiments, such as pads, pins, sockets, and the like. In an exemplary embodiment, the mating end 272 has a short electrical length downstream of the mating interface (for example, the curved ends of the beams forming stubs beyond the mating interfaces), leading to a short electrical stub. In an exemplary embodiment, because the first electrical connector 250 is able to float relative to the first circuit board 210, the mating ends 272 of the contacts 254 may have short mechanical stubs. For example the lengths of the mechanical stubs beyond the mating interfaces may be very short (for example, less than 1.0 mm) as the mating ends 272 do not need to accommodate for the tolerance of the circuit board mating. In an exemplary embodiment, because the contact modules 256 are able to float relative to the connector housing 252, the mating ends 272 of the contacts 254 may be very short as the mating ends 272 can accommodate at least some of the tolerance of the circuit board mating as such tolerance is accommodated by the spring loaded, floating movement of the electrical connector 250 (for example, as provided by the biasing members 244). The length of the stub at the mating end 272 may be short enough to just accommodate mechanical mating plus any contact wipe, but does not need to accommodate any circuit board mating tolerance.

The second electrical connector 350 includes a connector housing 352 holding second contacts 354 (FIG. 5) in a contact array. In various embodiments, the contacts 354 may be arranged together in second contact modules 356, also known as chicklets, which may be overmolded leadframes. The connector housing 352 includes a mating end 358 configured to be mated with the first electrical connector 250. The mating end 358 is at the front of the connector housing 352 (facing the mating end 258 of the first electrical connector 250). The second contacts 354 are exposed at the mating end 358 for mating with the first contacts 254.

In various embodiments, the second electrical connector 350 is a cable connector having cables (not shown) extending from the contact modules 356. The contact modules 356 may be movable within the connector housing 352 in the mating direction (for example, along the mating axis 264). For example, the contact modules 356 may be spring biased relative to the connector housing 352. In other various embodiments, the second electrical connector 350 is a board connector configured to be mounted directly to the second circuit board 310. The connector housing 352 includes a mounting end mounted to the second circuit board 310. In the illustrated embodiment, the second electrical connector 350 is a right-angle connector having the mounting end perpendicular to the mating end 358; however, other orientations are possible in alternative embodiments. The connector housing 352 may include mounting features for mounting the connector housing 352 to the circuit board 310, such as mounting lugs that receive threaded fasteners, press tabs, solder tabs, and the like. Alternatively, the contacts 354 may be used to mount the second electrical connector 350 to the circuit board 310, such as using press fit pins.

The second electrical connector 350 is configured to be mated with the first electrical connector 250 in the mating direction along the mating axis 264. In an exemplary embodiment, the second electrical connector 350 is a header connector. The second electrical connector 350 includes shroud walls forming a reception space for the first electrical connector 250. In an exemplary embodiment, the first electrical connector 250 (and/or the second electrical connector 350) may be pressed rearward during mating as the second circuit board assembly 300 is loaded into the equipment rack 110. The first contact modules 256 (and/or the second contact modules 356) may be pressed rearward during mating as the second circuit board assembly 300 is loaded into the equipment rack 110. The movement of the electrical connectors 250, 350 and/or the movement of the contact modules 256, 356 allows the contacts 254, 354 to be relatively short as the contacts 254, 354 do not need to accommodate for the circuit board mating tolerance, which may be approximately 1.5 mm, meaning that the first contacts 254 and/or the second contacts 354 may be shortened, such as by approximately 1.5 mm, compared to other systems.

The contacts 354 are provided at the mating end 358 for mating with the first electrical connector 250. In an exemplary embodiment, the contacts 354 are stamped and formed contacts. The contacts 354 have a metal body extending between a mating end 372 and a terminating end (not shown) opposite the mating end 372. In an exemplary embodiment, the terminating ends of the contacts 354 may be terminated directly to the circuit board 310, such as being soldered or press fit into plated vias of the circuit board 310. Alternatively, the contacts 354 may be terminated to cables rather than directly to the circuit board 310. The contacts 354 may be movable relative to the connector housing 352, such as when the contact modules 356 are moved relative to the connector housing 352.

The mating end 372 of each second contact 354 includes a mating interface configured to be electrically connected to the first contact 254. In the illustrated embodiment, the mating ends 372 include pins. The pins may be arranged in pairs. Other contact types can be used in alternative embodiments, such as pads, spring beams, sockets, and the like. In an exemplary embodiment, the second electrical connector 350 includes ground contacts 374 providing electrical shielding for the pins. The ground contacts 374 are C-shaped in the illustrated embodiment.

In an exemplary embodiment, the mating end 372 has a short electrical length downstream of the mating interface, leading to a short electrical stub. In an exemplary embodiment, because the first electrical connector 250 is able to float (press rearward) when mated with the first electrical connector 250, the mating ends 372 of the contacts 354 are very short as the mating ends 372 do not need to accommodate the tolerance of the circuit board mating as such tolerance is accommodated by the spring loaded, floating movement of the first electrical connector 250. In an exemplary embodiment, when the contact modules 356 are able to float (press rearward) when mated with the first electrical connector 250, the mating ends 372 of the contacts 354 are very short as the mating ends 372 do not need to accommodate the tolerance of the circuit board mating as such tolerance is accommodated by the floating movement of the contact modules 356. The length of the stub at the mating end 372 may be short enough to just accommodate mechanical mating plus any contact wipe, but does not need to accommodate any circuit board mating tolerance.

The floating mating interface provided by the connector mounts and/or the contact modules 256, 356 absorbs the circuit board mating tolerance (for example, absorbs 1.5 mm mating tolerance or more). The floating mating interface eliminates the need for the contact interface to be able to absorb the large rack mating tolerances allowing the use of contacts having short stubs. The stubs at the ends of the contacts 254 and/or 354 may be shortened (for example, less than 1.0 mm), which improves the performance of the communication system 100 by improving the signal integrity along the signal paths. The performance, particularly at high speeds (for example, above 100 Gbps and more particularly, above 200 Gbps) is improved compared to contacts having long electrical stubs.

Figure 6:
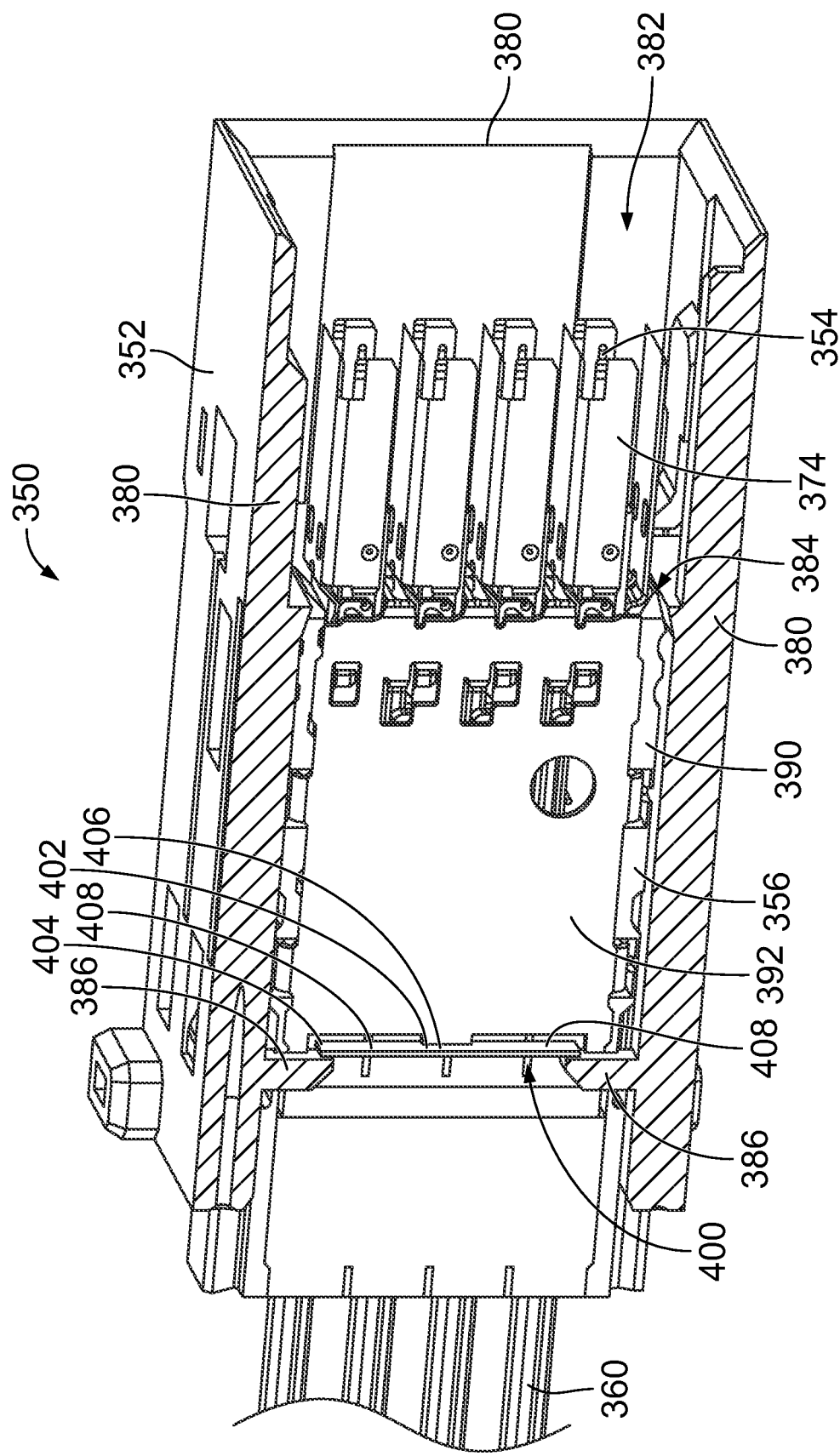
FIG. 6 is a partial sectional view of the second electrical connector in accordance with an exemplary embodiment.

FIG. 6 is a partial sectional view of the second electrical connector 350 in accordance with an exemplary embodiment. FIG. 6 shows one of the contact modules 356 coupled to the connector housing 352. In the illustrated embodiment, the second electrical connector 350 is a cable connector having cables 360 coupled to the contacts 354 and extending from the contact modules 356. In the illustrated embodiment, the contact modules 356 are movable relative to the connector housing 352. The contact modules 356 may float within the connector housing 352 when mated with the first electrical connector 250 (shown in FIG. 4) independently from each other.

The connector housing 352 has a plurality of walls 380 forming a contact module chamber 382. For example, the walls 380 may include side walls, an upper wall, a lower wall, a front wall, a rear wall, or other walls. The contact module chamber 382 receives the stack of contact modules 356. Optionally, the front portion of the contact module chamber 382 may receive the first electrical connector 250 (shown in FIG. 4). In various embodiments, the walls 380 may include internal walls, such as divider walls that divide the contact module chamber 382 into channels receiving corresponding contact modules 356. The connector housing 352 may include latching features 384 for securing the contact modules 356 in the contact module chamber 382. In an exemplary embodiment, the connector housing 352 includes one or more locating feature 386 for locating the contact modules 356 in the chamber 382. The locating features 386 are located in the chamber 382. In the illustrated embodiment, the locating features 386 are tabs extending from the upper and lower walls into the chamber 382. The locating features 386 may be located proximate to the rear of the connector housing 352. The locating features 386 may be parts of the divider walls defining the channels.

In an exemplary embodiment, the second contact module 356 is an overmolded leadframe. For example, a leadframe having a plurality of signal conductors is overmolded by a dielectric module body 390. The signal conductors form the contacts 354. The contacts 354 may be arranged in pairs.

In an exemplary embodiment, the second contact module 356 includes one or more ground shields 392 coupled to the side(s) of the second contact module 356. The ground shield 392 may be a stamped and formed shield. The ground shield 392 provides electrical shielding for the second contact module 356. The ground shield 392 includes the ground contacts 374 at the front. The ground contacts 374 may be integral with the ground shield 392. Alternatively, the ground contacts 374 may be separate and coupled to the ground shield 392.

In an exemplary embodiment, the electrical connector 350 includes contact module biasing members 400 between the contact modules 356 and the connector housing 352. The contact module biasing members 400 forward bias the contact modules 356 in the contact module chamber 382. The contact module biasing members 400 are compressible to allow the contact modules 356 to move independent from each other relative to the connector housing 352. For example, when the first electrical connector 250 is coupled to the second electrical connector 350 the contact modules 356 may be pressed rearward against the spring forces of the contact module biasing members 400. In an exemplary embodiment, the contact modules 356 are slidable in a sliding direction parallel to the mating direction with the first electrical connector 250 against the spring forces of the contact module biasing members 400.

In various embodiments, the contact module biasing members 400 extend along one or both sides of the contact module 356 such that the contact module biasing members 400 are located between adjacent contact modules 356. In other various embodiments, the contact module biasing members extend along tops and/or bottoms of the contact modules 356 to engage the upper wall or the lower wall, respectively, of the connector housing 352.

In an exemplary embodiment, the contact module biasing members 400 are integral with the contact modules 356. For example, the contact module biasing members 400 are stamped and formed with the ground shields 392. In an exemplary embodiment, the contact module biasing members 400 include deflectable springs. Each contact module biasing member 400 includes a fixed end 402 and a free end 404 at the distal end of the contact module biasing member 400 opposite the fixed end 402. The fixed end 402 defines a base 406 of the contact module biasing member 400. The base 406 extends from the ground shield 392. For example, the base 406 may be bent or folded from the ground shield 392, such as perpendicular to the ground shield 392. The contact module biasing member 400 includes a spring arm 408 between the ends 402, 404. The spring arm 408 is cantilevered from the base 406. The spring arm 408 extends from the ground shield 392 to the free end 404. The free end 404 is configured to engage the connector housing 352, such as the corresponding locating feature 386. The free end 404 engages the connector housing 352 to position the contact modules 356 relative to the connector housing 352. In an exemplary embodiment, the contact module 356 includes multiple contact module biasing members 400. For example, the contact module 356 includes an upper spring arm 408a and a lower spring arm 408b. The upper spring arm 408a engages the upper locating feature 386a and the lower spring arm 408b engages the lower locating feature 386b.

When assembled, the contact modules 356 are held in the connector housing 352. The contact module biasing members 400 forward bias the contact modules 356 in the chamber 382. During mating, the contact modules 356 are slidable in the sliding direction (for example, rearward). As the contact modules 356 are moved rearward, the spring arms 408 are flexed creating spring forces that tend to press the contact modules 356 forward. The spring force may be based on the size of the spring arm 404 (for example, height, width, thickness). In an exemplary embodiment, the spring force may be greater than a mating force (for example, wiping contact force) between the first and second contacts 254, 354 such that the contact modules 356 do not move during mating. In such embodiments, the contact modules 356 move relative to the connector housing 352 during an over-mating condition. For example, the over-mating may occur during the final loading or locking of the first and second circuit boards 210, 310 in the equipment rack 110. The contact modules 356 may be compressible in the rearward sliding direction to accommodate the final travel of the first and second circuit boards 210, 310, such as the 1.5 mm mating tolerance.

Figure 7:
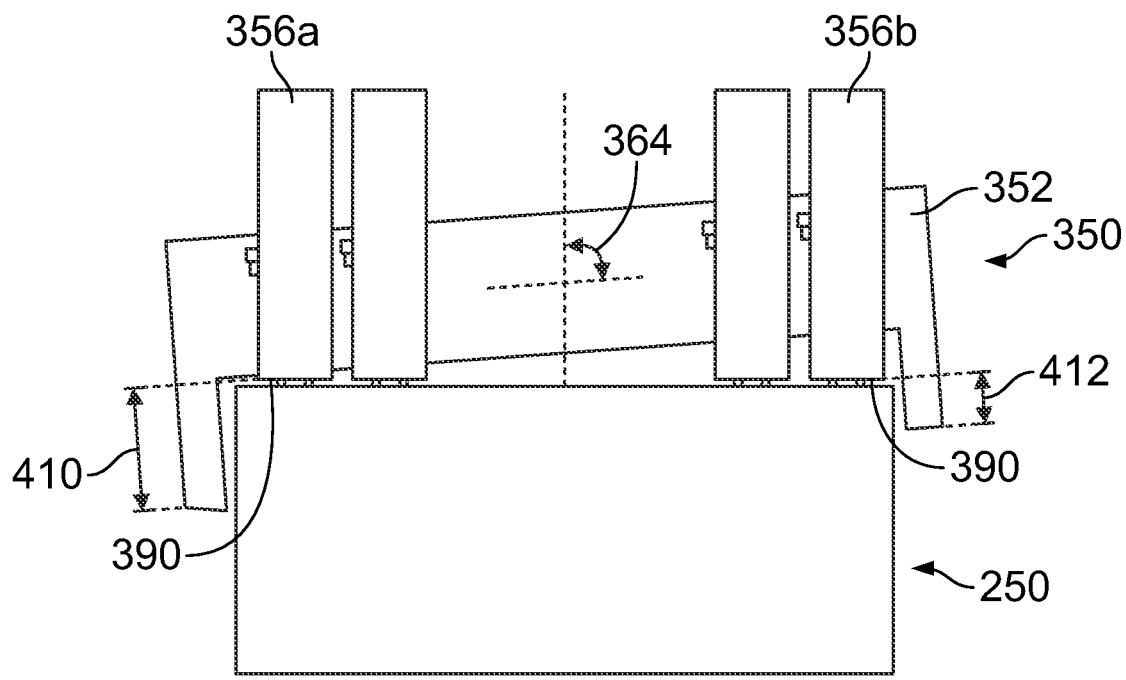
FIG. 7 is a schematic view of the first electrical connector mated with the second electrical connector in accordance with an exemplary embodiment.

FIG. 7 is a schematic view of the first electrical connector 250 mated with the second electrical connector 350 in accordance with an exemplary embodiment. FIG. 7 illustrates the first and second electrical connectors 250, 350 mated at a skew angle 364 relative to the mating axis 264. The skew angle 364 is non-perpendicular to the mating axis 264. When mated at the skew angle, the contact modules 356 are movable within the connector housing 352 to accommodate the angled mating interface. For example, the contact modules 356 are independently movable relative to the connector housing 352 such that the contact modules 356 may be compressed different distances when mated with the first electrical connector 250. In the illustrated embodiment, the contact modules 356 on the left side are compressed further than the contact modules 356 on the right side. For example, the front of the module body 390 of the left side contact module 356a is located a first distance 410 from the front of the connector housing 352 and the front of the module body 390 of the right side contact module 356b is located a second distance 412 from the front of the connector housing 352. The second distance 412 is different than the first distance 410.

Figure 8:
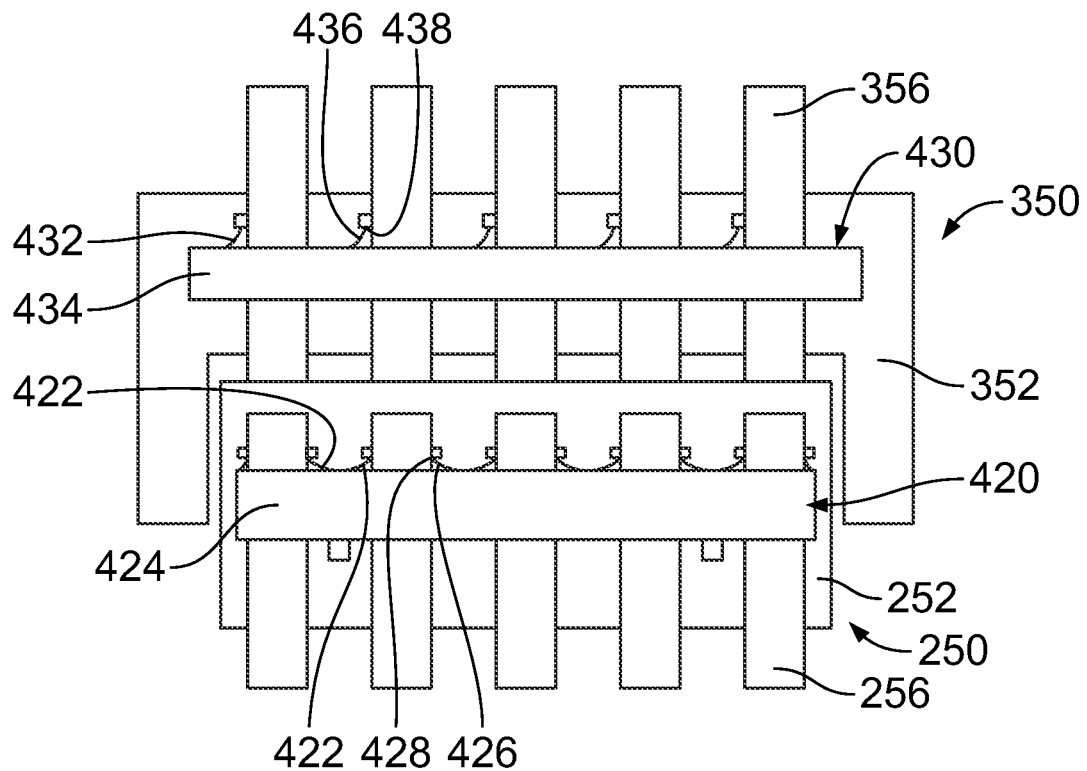
FIG. 8 is a schematic view of the first electrical connector mated with the second electrical connector in accordance with an exemplary embodiment

FIG. 8 is a schematic view of the first electrical connector 250 mated with the second electrical connector 350 in accordance with an exemplary embodiment. FIG. 8 illustrates the first electrical connector 250 having movable contact modules 256 and the second electrical connector 350 having movable contact modules 356. In the illustrated embodiment, the first electrical connector 250 includes a biasing device 420 coupled to the connector housing 252. The biasing device 420 includes contact module biasing members 422 extending from a base 424. The contact module biasing members 422 engage the corresponding contact modules 256 to forward bias the contact modules 256. The contact module biasing members 422 have spring arms 426 with distal ends 428 configured to engage the contact modules 256. The contact module biasing members 422 may engage the sides of the contact modules 256. Alternatively, the contact module biasing members 422 may engage the tops and/or the bottoms of the contact modules 256. In the illustrated embodiment, the second electrical connector 350 includes a biasing device 430 coupled to the connector housing 352. The biasing device 430 includes contact module biasing members 432 extending from a base 434. The contact module biasing members 432 engage the corresponding contact modules 356 to forward bias the contact modules 356. The contact module biasing members 432 have spring arms 436 with distal ends 438 configured to engage the contact modules 356. The contact module biasing members 432 may engage the sides of the contact modules 356. Alternatively, the contact module biasing members 432 may engage the tops and/or the bottoms of the contact modules 356.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. An electrical connector comprising:
a connector housing having a mating end at a front of the connector housing configured to be mated with a mating electrical connector, the connector housing including a contact module chamber;
a stack of contact modules received in the contact module chamber, each contact module including a module body holding a plurality of contacts, the contacts having mating ends at the mating end of the connector housing for mating with the mating electrical connector; and
contact module biasing members between the contact modules and the connector housing to forward bias the contact modules relative to the connector housing in the contact module chamber, wherein the contact module biasing members are compressible to allow the contact modules to move independent from each other relative to the connector housing in the contact module chamber when mated with the mating electrical connector, wherein the contact modules include a first contact module and a second contact module, the module body of the first contact module configured to be located a first distance from the front of the connector housing, the module body of the second contact module configured to be located a second distance from the front of the connector housing different than the first distance.

2. The electrical connector of claim 1, wherein the contact modules are slidable in a sliding direction parallel to a mating direction with the mating electrical connector.

3. The electrical connector of claim 1, wherein the contact modules have cables electrically connected to the contacts and extending from the module bodies, the cables being flexible to allow movement of the contact modules relative to the contact housing.

4. The electrical connector of claim 1, wherein the contact module biasing members are integral with the contact modules, ends of the contact module biasing members engaging the connector housing to position the contact modules relative to the connector housing.

5. The electrical connector of claim 1, wherein each contact module biasing member includes a first end and a second end opposite the first end, the first end extending from the contact module, the second end coupled to the connector housing.

6. The electrical connector of claim 1, wherein each contact module includes a ground shield, the contact module biasing members being stamped from the ground shield, the contact module biasing members having distal ends engaging the connector housing.

7. The electrical connector of claim 1, wherein each contact module biasing member includes a base and a spring arm extending from the base, the base being coupled to the contact module, the spring arm engaging the connector housing.

8. The electrical connector of claim 1, wherein each contact module biasing member includes an upper spring arm and a lower spring arm, the upper spring arm engaging an upper locating feature of the connector housing, the lower spring arm engaging a lower locating feature of the connector housing.

9. The electrical connector of claim 1, wherein the contact module biasing members are coupled to the connector housing and includes spring arms having distal ends engaging the contact modules to forward bias the contact modules.

10. The electrical connector of claim 1, wherein the contact module biasing members extend along sides of the contact modules, the contact module biasing members being located between the contact modules.

11. A circuit board assembly comprising:
a circuit board having a mounting surface, the circuit board having a mating edge and side edges extending from the mating edge to a rear edge, the circuit board having a board guide feature for locating the circuit board in an equipment rack; and
an electrical connector mounted to the mounting surface of the circuit board at the mating edge, the electrical connector including a connector housing having a mating end at a front of the connector housing configured to be mated with a mating electrical connector, the connector housing including a contact module chamber, the electrical connector including a stack of contact modules received in the contact module chamber, each contact module including a module body holding a plurality of contacts, the contacts having mating ends at the mating end of the connector housing for mating with the mating electrical connector, and the electrical connector including contact module biasing members between the contact modules and the connector housing to forward bias the contact modules in the contact module chamber, wherein the contact module biasing members are compressible to allow the contact modules to move independent from each other relative to the connector housing and the circuit board in the contact module chamber when mated with the mating electrical connector.

12. The circuit board assembly of claim 11, wherein the electrical connector is movable relative to the circuit board during mating with the mating electrical connector.

13. The circuit board assembly of claim 11, wherein the electrical connector further includes a connector mount for locating the electrical connector relative to the circuit board, the connector mount having a bracket coupled to the mounting surface of the circuit board proximate to the mating edge, the connector mount having a biasing member coupled to the bracket and coupled to the mounting feature of the electrical connector, the biasing member being compressible along a compression axis parallel to the mating direction to allow the electrical connector to float in the mating direction relative to the circuit board.

14. The circuit board assembly of claim 11, wherein the contact modules are slidable in a sliding direction parallel to a mating direction with the mating electrical connector.

15. The circuit board assembly of claim 11, wherein the contact modules include a first contact module and a second contact module, the module body of the first contact module being located a first distance from the front of the connector housing, the module body of the second contact module located a second distance from the front of the connector housing different than the first distance.

16. The circuit board assembly of claim 11, wherein the contact module biasing members are integral with the contact modules, ends of the contact module biasing members engaging the connector housing to position the contact modules relative to the connector housing.

17. The circuit board assembly of claim 11, wherein each contact module includes a ground shield, the contact module biasing members being stamped from the ground shield, the contact module biasing members having distal ends engaging the connector housing.

18. A communication system comprising:
a first circuit board assembly including a first circuit board and a first electrical connector coupled to the first circuit board, the first electrical connector including a first connector housing having a mating end at a front of the first connector housing, the first connector housing including a first contact module chamber, the first electrical connector including a stack of contact modules received in the first contact module chamber, each contact module including a module body holding a plurality of first contacts, the first contacts having mating ends at the mating end of the first connector housing, and the first electrical connector including contact module biasing members between the contact modules and the first connector housing to forward bias the contact modules in the first contact module chamber; and
a second circuit board assembly including a second circuit board and a second electrical connector coupled to the second circuit board, the second electrical connector having a second connector housing holding second contacts in a contact array, the second connector housing having a mating end coupled to the mating end of the first connector housing along a mating axis;
wherein the contact module biasing members are compressible to allow the module body and the first contacts of each contact module to float independent from each other relative to the first connector housing in the first contact module chamber, wherein the contact modules include a first contact module and a second contact module, the module body of the first contact module configured to be located a first distance from the front of the connector housing, the module body of the second contact module configured to be located a second distance from the front of the connector housing different than the first distance.

19. The communication system of claim 18, wherein each contact module includes a ground shield, the contact module biasing members being stamped from the corresponding ground shield, the contact module biasing members having distal ends engaging the first connector housing.

20. The communication system of claim 18, wherein each contact module has cables electrically connected to the first contacts and extending from the module body, the cables being flexible to allow movement of the contact module relative to the first contact housing.

\* \* \* \* \*